(12) United States Patent
Fukumoto et al.

(10) Patent No.: US 10,978,364 B2
(45) Date of Patent: Apr. 13, 2021

(54) SEMICONDUCTOR MODULE

(71) Applicant: Mitsubishi Electric Corporation, Chiyoda-ku (JP)

(72) Inventors: Akihisa Fukumoto, Chiyoda-ku (JP); Yasushi Nakayama, Chiyoda-ku (JP); Hiroshi Kobayashi, Chiyoda-ku (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/606,011

(22) PCT Filed: May 23, 2018

(86) PCT No.: PCT/JP2018/019846
§ 371 (c)(1),
(2) Date: Oct. 17, 2019

(87) PCT Pub. No.: WO2018/235511
PCT Pub. Date: Dec. 27, 2018

(65) Prior Publication Data
US 2020/0273760 A1 Aug. 27, 2020

(30) Foreign Application Priority Data
Jun. 22, 2017 (JP) .............................. JP2017-122234

(51) Int. Cl.
*H01L 21/66* (2006.01)
*H01L 23/049* (2006.01)
(Continued)

(52) U.S. Cl.
CPC ............ *H01L 22/34* (2013.01); *H01L 23/049* (2013.01); *H01L 23/3735* (2013.01);
(Continued)

(58) Field of Classification Search
CPC ....................................................... H01L 22/34
(Continued)

(56) References Cited

U.S. PATENT DOCUMENTS

| 6,930,380 B2 * | 8/2005 | Shimanuki | .............. H01L 24/48 |
| | | | 257/691 |
| 7,098,683 B2 * | 8/2006 | Matsubara | ......... G01R 31/2884 |
| | | | 318/490 |

(Continued)

FOREIGN PATENT DOCUMENTS

| JP | 10-56130 A | 2/1998 |
| JP | 2004-363458 A | 12/2004 |

(Continued)

OTHER PUBLICATIONS

International Search Report dated Jul. 24, 2018 in PCT/JP2018/019846 filed on May 23, 2018.

*Primary Examiner* — Ajay Arora
(74) *Attorney, Agent, or Firm* — XSENSUS LLP (57) ABSTRACT

A semiconductor module is obtained in which breakage of the semiconductor module can be detected in advance while suppressing increase in manufacturing cost. A semiconductor module includes a semiconductor element, a circuit board, a resistor, a first wiring member, and a detector. The circuit board includes a circuit pattern. The resistor is connected to a surface of the circuit pattern. The first wiring member directly connects the resistor to the semiconductor element. In the first wiring member, at least part of current flowing from the semiconductor element to the circuit pattern flows. The detector is configured to detect at least one of a change of a voltage drop value in the resistor and a change of a current value in the resistor.

7 Claims, 6 Drawing Sheets

(51) Int. Cl.
*H01L 23/373* (2006.01)
*H01L 23/00* (2006.01)
*H01L 25/16* (2006.01)

(52) U.S. Cl.
CPC ............ *H01L 24/73* (2013.01); *H01L 25/165* (2013.01); *H01L 2224/73265* (2013.01); *H01L 2924/1203* (2013.01); *H01L 2924/1207* (2013.01); *H01L 2924/13055* (2013.01); *H01L 2924/13091* (2013.01)

(58) Field of Classification Search
USPC .......................................................... 257/48
See application file for complete search history.

(56) References Cited

U.S. PATENT DOCUMENTS

2004/0245622 A1  12/2004  Shimanuki et al.
2005/0212549 A1   9/2005  Matsubara et al.

FOREIGN PATENT DOCUMENTS

| JP | 2005-286009 A | 10/2005 |
| JP | 2011-249475 A | 12/2011 |
| JP | 2015-228447 A | 12/2015 |

* cited by examiner

SEMICONDUCTOR MODULE

TECHNICAL FIELD

The present invention relates to a semiconductor module, particularly, a semiconductor module, a state of which can be detected.

BACKGROUND ART

Conventionally, a semiconductor module, such as a power module, has been known. In the semiconductor module, a failure of supply of power may occur due to breakage of a wire connected to an electrode of a semiconductor element, with the result that the semiconductor module may be destroyed. A method for detecting such destruction of the semiconductor module in advance has been proposed conventionally.

Japanese Patent Laying-Open No. 2005-286009 (hereinafter, referred to as Patent Literature 1) proposes a method for detecting destruction of a semiconductor module in advance by connecting, in addition to a wire for supplying principal current, a dummy wire to a semiconductor element. The dummy wire in Patent Literature 1 has a joining strength weaker than that of the wire for supplying principal current, and becomes broken prior to the wire for supplying principal current. Thus, by detecting the breakage of the dummy wire before the wire for supplying principal current is destroyed, breakage of the semiconductor module can be detected in advance.

Japanese Patent Laying-Open No. 10-56130 (hereinafter, referred to as Patent Literature 2) discloses a semiconductor module, wherein an emitter electrode of a semiconductor element and each of two leading terminal electrodes are connected to each other via a wire, the two leading terminal electrodes are connected to each other via a resistor, and a voltage value between the two leading terminal electrodes can be measured. In the semiconductor module disclosed in Patent Literature 2, by measuring the voltage value between the two leading terminal electrodes, it is possible to detect deterioration of the connection portion due to electromigration between one leading terminal electrode and the wire.

CITATION LIST

Patent Literature

PTL 1: Japanese Patent Laying-Open No. 2005-286009
PTL 2: Japanese Patent Laying-Open No. 10-56130

SUMMARY OF INVENTION

Technical Problem

Since the dummy wire is connected to the semiconductor element in the semiconductor module disclosed in Patent Literature 1, an extra area is required for the semiconductor element. Since the semiconductor element is expensive among members included in the semiconductor module, a large area of the semiconductor element is a factor of increase in manufacturing cost of the semiconductor module.

In the semiconductor module disclosed in Patent Literature 2, in order to measure the voltage value, the two leading terminal electrodes are connected to each other via the resistor. Hence, the area of the semiconductor module becomes larger than that in the case where the voltage value is not measured, i.e., that in a configuration in which only one leading terminal electrode and the emitter electrode are connected to each other. Therefore, sizes of members included in the semiconductor module also become large, with the result that manufacturing cost of the semiconductor module is increased.

The present invention has been made to solve the foregoing problem, and has an object to obtain a semiconductor module, breakage of which can be detected in advance while suppressing increase in manufacturing cost of the semiconductor module.

Solution to Problem

A semiconductor module according to the present disclosure includes a semiconductor element, a circuit board, a resistor, a first wiring member, and a detector. The circuit board includes a circuit pattern. The resistor is connected to a surface of the circuit pattern. The first wiring member directly connects the semiconductor element to the resistor. In the first wiring member, at least part of current flowing from the semiconductor element to the circuit pattern flows. The detector detects at least one of a change of a voltage drop value in the resistor and a change of a current value in the resistor.

Advantageous Effects of Invention

According to the present disclosure, a change of a connection state between the semiconductor element and the circuit pattern via the first wiring member can be detected by the detector. Hence, based on the detection of the above-described change by the detector, breakage of the semiconductor module can be detected in advance. Further, since no dummy wire is used for detection of breakage of the semiconductor module unlike in the conventional art, an extra area for the semiconductor element is not required which would have been otherwise caused by installing such a dummy wire. Accordingly, manufacturing cost of the semiconductor module can be suppressed from being increased.

DESCRIPTION OF EMBODIMENTS

The following describes embodiments of the present invention with reference to figures. It should be noted that in the below-described figures, the same or corresponding portions are given the same reference characters and are not described repeatedly.

First Embodiment

<Configuration of Semiconductor Module>

Figure 1:
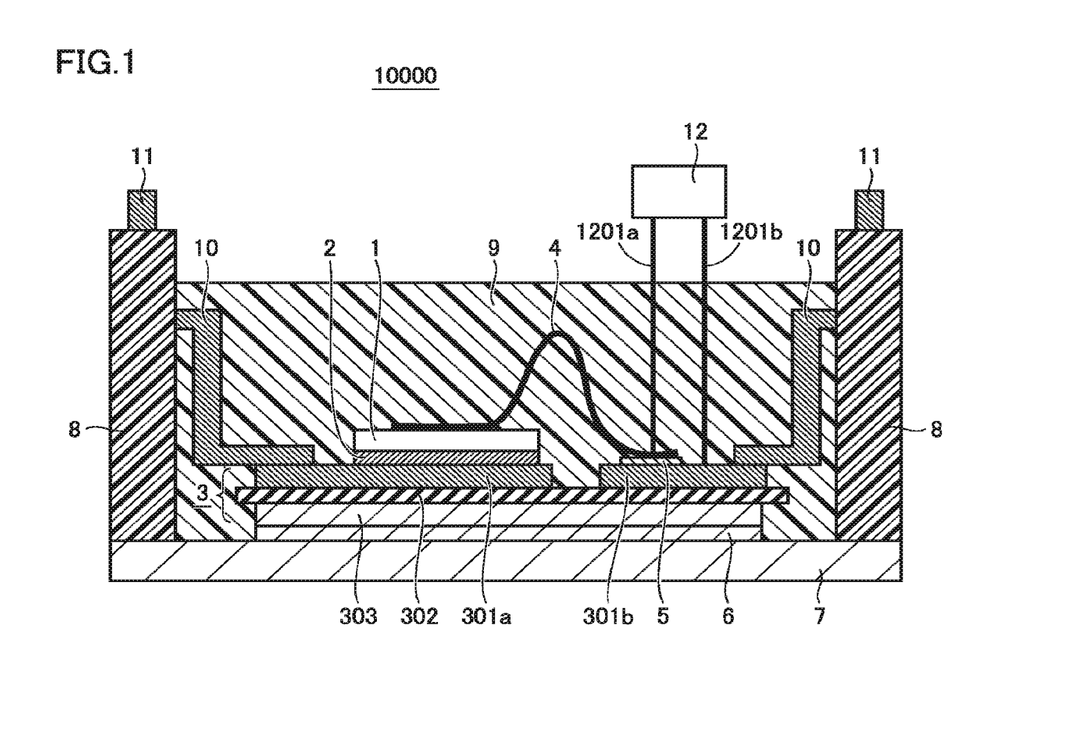
FIG. 1 is a schematic cross sectional view showing a basic configuration of a semiconductor module according to a first embodiment of the present invention.
Figure 2:
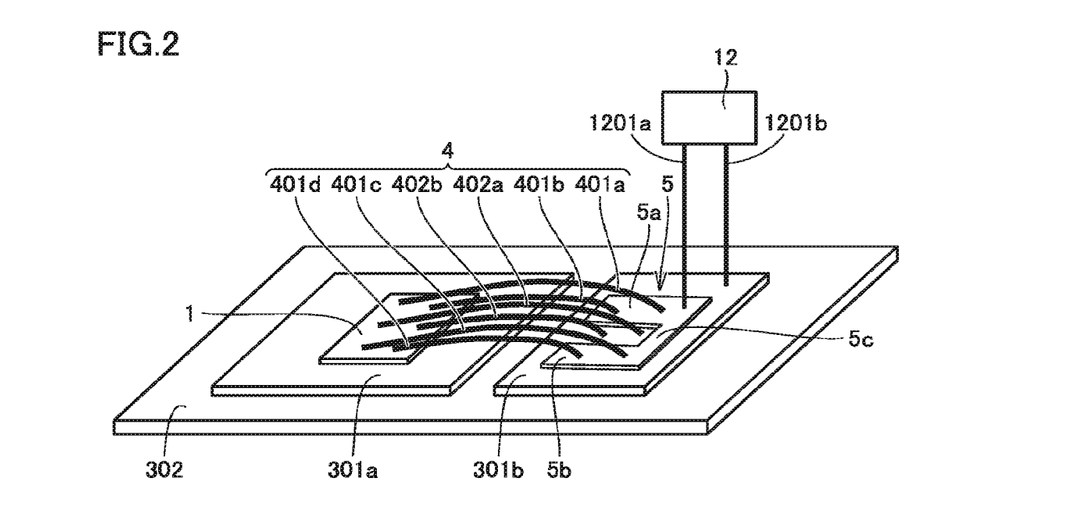
FIG. 2 is a partial schematic perspective view showing a specific configuration of the semiconductor module shown in FIG. 1.

FIG. 1 is a schematic cross sectional view showing a basic configuration of a semiconductor module 10000, which is a power module according to a first embodiment of the present invention. FIG. 2 is a partial schematic perspective view showing a specific configuration of semiconductor module 10000 shown in FIG. 1. As shown in FIG. 1, semiconductor module 10000 mainly includes: a base plate 7; a circuit board 3 serving as an insulating circuit board; a case 8; a semiconductor element 1 serving as a power semiconductor element; a detector 12 serving as a detection mechanism; and an external terminal 11. Circuit board 3 includes an insulating member 302, a plate-like member 303, a circuit pattern 301a (first circuit pattern), and a circuit pattern 301b (second circuit pattern). Insulating member 302 has a plate-like shape, for example. Member 303 is connected to one surface of insulating member 302. Each of circuit patterns 301a, 301b is disposed on the other surface of insulating member 302 opposite to its one surface to which member 303 is connected.

Case 8 is connected to an outer peripheral portion of base plate 7 in semiconductor module 10000. Case 8 has an annular shape to surround the outer peripheral portion of base plate 7. In an inner portion surrounded by base plate 7 and case 8, semiconductor element 1 and circuit board 3 are disposed. Semiconductor element 1 and circuit board 3 are insulatively sealed by a sealing material 9.

Semiconductor element 1 is joined to the surface of circuit pattern 301a of circuit board 3 by a joining material 2. Of the main surfaces of semiconductor element 1, the backside surface thereof facing circuit board 3 is joined to circuit pattern 301a with joining material 2 being interposed therebetween. One end of a wiring member 4 is connected to the front surface of semiconductor element 1 opposite to the backside surface that is in contact with joining material 2. The other end of wiring member 4 extends to circuit pattern 301b on which semiconductor element 1 is not disposed. Resistor 5 exists between the other end of wiring member 4 and circuit pattern 301b. That is, wiring member 4 is connected to circuit pattern 301b via resistor 5. In this way, at least part of current flowing in a current path that includes the semiconductor element and that extends from circuit pattern 301b to circuit pattern 301a flows in resistor 5.

Circuit board 3 has a surface joined to base plate 7 by joining material 6. One end of wiring member 10 is attached to circuit pattern 301a of circuit board 3. The other end of wiring member 10 is embedded in case 8 and is connected to external terminal 11. Resistor 5 is connected to detector 12 configured to measure a voltage drop value or current value in resistor 5. Here, resistor 5 has two main surfaces. To one of the main surfaces, wiring member 4 is connected. To the other of the main surfaces, circuit pattern 301b is connected. One of the two terminals of detector 12 is connected to the one main surface of resistor 5 via a third wiring member 1201a. The other of the two terminals of detector 12 is connected to circuit pattern 301b via a fourth wiring member 1201b. One terminal of detector 12 has substantially the same potential as that of the one main surface of resistor 5. The other terminal of detector 12 has substantially the same potential as that of the other main surface of resistor 5. Each of third and fourth wiring members 1201a, 1201b is connected to a region close to resistor 5 or is connected to resistor 5 itself. Accordingly, the current value or voltage drop value in resistor 5 is precisely measured by detector 12.

It should be noted that in the above description, a case type power module has been illustrated as semiconductor module 10000; however, the structure according to the embodiment of the present invention is also applicable to a different type of power module from semiconductor module 10000 shown in FIG. 1, such as a mold type module.

Semiconductor element 1 may be an insulated gate bipolar transistor (IGBT), a free wheel diode (FWD), a MOSFET (Metal Oxide Semiconductor Field Effect Transistor), or the like. In semiconductor module 10000 of FIG. 1, one semiconductor element 1 is provided but the number of semiconductor elements 1 is not limited to one. Semiconductor module 10000 may include a plurality of semiconductor elements 1. For example, in a circuit design of semiconductor module 10000, a plurality of power semiconductor elements may be selectively included as semiconductor elements 1.

For joining material 2, any material can be used as long as semiconductor element 1 is connected to circuit board 3. Typically, joining material 2 is a lead-free solder. Additionally, as joining material 2, it is possible to select a silver nano particle paste, a silver paste including an epoxy resin serving as an electrically conductive adhesive agent, and the like; however, joining material 2 is not limited to these.

As a material for each of circuit patterns 301a, 301b, any material can be used as long as the material has electrical conductivity. For example, as the material of each of circuit patterns 301a, 301b, typically, a metal such as Cu or Al is used. A material having high electrical conductivity may be used.

For insulating member 302 of circuit board 3, a ceramic, which is an inorganic material, can be used, such as alumina (Aluminum Oxide), aluminum nitride, or silicon nitride. For insulating member 302, an organic material filled with a filler may be used. Examples of the organic material include an epoxy resin, a polyimide resin, a cyanate-based resin, and the like. As the filler, a ceramic filler can be used, for example. As the material of the ceramic filler, alumina (Aluminum Oxide), aluminum nitride, boron nitride, or the like may be used, for example. It should be noted that the material of insulating member 302 is not limited to the examples illustrated above.

As a material of member 303, a metal can be used, for example. Cu or Al is typically used as the material of member 303. Any material may be used as the material of member 303 as long as the material has high thermal conductivity. For wiring member 4, a wire, a ribbon or the like each composed of a metal may be used, for example.

Examples of the material of wiring member 4 include aluminum (Al), copper (Cu), or alloys mainly composed of these metals. Any material may be used as the material of wiring member 4 as long as the material has electrical conductivity. The material of wiring member 4 is not limited to the materials described above.

As the material of joining material 6, any material can be applied as long as circuit board 3 can be fixed to base plate 7. As joining material 6, a lead-free solder is used typically. As the material of base plate 7, any material may be used as long as the material has excellent thermal conductivity. For example, copper can be used as the material of base plate 7.

As the material of case 8, an insulating material having high heat resistance can be used. For example, as the material of case 8, a thermoplastic resin having a high heat resistance can be used, such as poly phenylen sulfide or poly butylene terephthalate.

As the material of sealing material 9, any insulating material can be used. For example, a silicone-based resin material can be used as the material of sealing material 9. Additional examples of the material of sealing material 9 include an urethane resin, an epoxy resin, a polyimide resin, a polyamide resin, a polyamide imide resin, an acrylic resin, a rubber material, and the like. Moreover, as sealing material 9, a layered body may be used in which a plurality of members are layered. For example, as sealing material 9, there may be used a layered body in which an epoxy resin layer is layered on a silicone gel layer. The number of layers in the layered body of sealing material 9 may be more than or equal to three.

For each of the materials of wiring member 10 and external terminal 11, it is preferable to use a metal in view of electrical and mechanical characteristics. For example, each of the materials of wiring member 10 and external terminal 11 may be one of aluminum (Al), copper (Cu), silver (Ag), nickel (Ni), and gold (Au), or may be an alloy mainly composed of one of these metals. The above is merely illustration and is not restriction.

With reference to FIG. 2, the following describes an exemplary specific configuration of semiconductor module 10000 shown in FIG. 1. FIG. 2 is a schematic perspective view for illustrating a feature of the first embodiment of the present invention in detail. FIG. 2 only shows portions necessary for the detailed explanation in the configuration shown in FIG. 1.

As shown in FIG. 2, a plurality of wiring members 4 are connected to semiconductor element 1. Each of first wiring members 401a to 401d, which are parts of the plurality of wiring members 4, has one end directly joined to a surface of resistor 5 located opposite to a location of resistor 5 to which circuit pattern 301b is connected. The other end of each of first wiring members 401a to 401d is directly joined to a surface of semiconductor element 1 located opposite to a location of semiconductor element 1 to which circuit pattern 301a is connected. Each of second wiring members 402a, 402b, which are another parts of the plurality of wiring members 4, is not connected to resistor 5 and has one end directly joined to circuit pattern 301b. The other end of each of second wiring members 402a, 402b is directly joined to the surface of semiconductor element 1 located opposite to the location of semiconductor element 1 to which circuit pattern 301a is connected. Resistor 5 includes: a first region 5a and a second region 5b to which first wiring members 401a to 401d are connected; and a third region 5c that connects first region 5a to second region 5b. First region 5a and second region 5b are disposed with a space being interposed therebetween. First wiring members 401a, 401b are connected to first region 5a of resistor 5. First wiring members 401c, 401d are connected to second region 5b of resistor 5. Second wiring members 402a, 402b are connected to an exposed surface portion of circuit pattern 301b between first region 5a and second region 5b.

According to such a configuration, at least part of current flowing in the current path that extends from circuit pattern 301b to circuit pattern 301a and that includes semiconductor element 1 flows in resistor 5. At least part of current flowing from semiconductor element 1 to circuit pattern 301b flows in each of first wiring members 401a to 401d wired to resistor 5. Each of second wiring members 402a, 402b not wired to resistor 5 serves as a power supply path having an electric resistance lower by the electric resistance of resistor 5 than that of each of first wiring members 401a to 401d wired to resistor 5. Hence, an amount of current flowing in each of second wiring members 402a, 402b becomes larger than that in each of first wiring members 401a to 401d, with the result that second wiring members 402a, 402b will be broken prior to first wiring members 401a to 401d. When second wiring members 402a, 402b are broken, all the current flows into resistor 5 via first wiring members 401a to 401d, thus resulting in an increased amount of current in resistor 5. As a result, detector 12 can detect an increase of current value or increase of voltage drop value in resistor 5.

At the point of time at which the increase of the current value or voltage drop value in resistor 5 is measured by detector 12, many of first wiring members 401a to 401d, which are wires or ribbons for supplying power, remain. Accordingly, at this point of time, the function of semiconductor module 10000 is not immediately impaired. In the manner described above, the failure of semiconductor module 10000 can be securely detected before the function thereof is lost completely.

Resistor 5 may have any shape. Resistor 5 may have a shape with more than or equal to two main surfaces, such as a block-like shape or a thin-plate-like shape. As shown in FIG. 1 and FIG. 2, resistor 5 and circuit pattern 301b may be joined to each other directly with no joining material being interposed therebetween, using an ultrasonic joining method or the like, for example.

Figure 3:
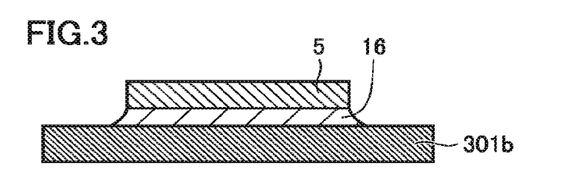
FIG. 3 is an enlarged schematic partial cross sectional view of a modification of the semiconductor module shown in FIG. 2.

As shown in FIG. 3, resistor 5 and circuit pattern 301b can be joined to each other using joining material 16 such as a solder. FIG. 3 is an enlarged schematic partial cross sectional view of a modification of semiconductor module 10000 shown in FIG. 2. In FIG. 3, the main surface of resistor 5 facing circuit pattern 301b in the two main surfaces of resistor 5 is connected to circuit pattern 301b via joining material 16. Joining material 16 may be composed of any material as long as the material has electrical conductivity.

Figure 4:
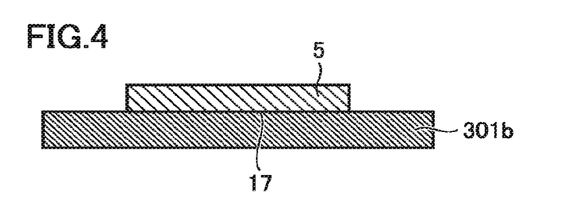
FIG. 4 is an enlarged schematic partial cross sectional view of another modification of the semiconductor module shown in FIG. 2.

As shown in FIG. 4, resistor 5 may be formed by directly providing, on surface 17 of circuit pattern 301b, the material to be resistor 5. For the formation of resistor 5, it is possible to use, for example, a method such as a vapor deposition method or a method for applying a sintering paste, which is to be resistor 5 and contains fine metal particles, onto the surface of circuit pattern 301b and performing heat treatment thereto. As the material of resistor 5, any material can be used as long as resistor 5 and circuit pattern 301b can be mechanically and electrically connected to each other. Typically, as resistor 5, there may be used a complex body of a copper foil and a solder joining material, or there may be used a nichrome alloy layer formed on the surface of circuit pattern 301b using the vapor deposition method.

The resistance value of resistor 5 is important in the present embodiment. When the resistance value of resistor 5 is increased, detection of a fluctuation of current value or voltage fluctuation value by detector 12 is facilitated. However, this leads to excessive current concentration on second wiring members 402a, 402b not wired to resistor 5, with the result that second wiring members 402a, 402b may be broken at an early stage. In this case, the change of state of semiconductor module 10000 is detected at a timing that is too earlier than the actual module life. As a result, the module life of semiconductor module 10000 may be underestimated. For this reason, the resistance value of resistor 5 should be smaller than the resistance value of each of first wiring members 401a to 401b. For example, when an aluminum wire having a length of 20 mm and a diameter of 300 μm is used as each of first wiring members 401a to 401d, the resistance value of each of first wiring members 401a to 401d is 2.1 mΩ. The resistance value of resistor 5 can be smaller than 2.1 mΩ. In this case, as resistor 5, a metal thin plate or a thin film can be used.

<Function and Effect>

Semiconductor module 10000 according to the present disclosure includes semiconductor element 1, circuit board 3, resistor 5, first wiring members 401a to 401d, and detector 12. Circuit board 3 includes circuit pattern 301b. Resistor 5 is connected to the surface of circuit pattern 301b. Each of first wiring members 401a to 401d connects semiconductor element 1 to resistor 5. That is, each of first wiring members 401a to 401d directly connects semiconductor element 1 to resistor 5, and at least part of the current flowing from semiconductor element 1 to circuit pattern 301b flows therein. Detector 12 is configured to detect at least one of the change of the voltage drop value in resistor 5 and the change of the current value in resistor 5.

In this way, the voltage drop value or current value in resistor 5 is changed upon occurrence of a change of state, such as progress of local breakage or occurrence of joining failure, at one of the connection portion between semiconductor element 1 and each of first wiring members 401a to 401d, first wiring members 401a to 401d themselves, and the connection portion between resistor 5 and each of first wiring members 401a to 401d. In semiconductor module 10000, the above-described change can be detected by detector 12. That is, detector 12 can detect a change of the connection state between semiconductor element 1 and circuit pattern 301b, by way of first wiring members 401a to 401d. Hence, based on the detection of the above-described change by detector 12, breakage of semiconductor module 10000 can be detected in advance. Accordingly, maintenance for semiconductor module 10000, such as inspection, can be performed before semiconductor module 10000 is completely destroyed. Further, since first wiring members 401a to 401d are directly connected to resistor 5, the change of state of each of first wiring members 401a to 401d directly affects the voltage drop value or current value in resistor 5. Accordingly, the change of state of each of first wiring members 401a to 401d can be detected with high sensitivity.

In semiconductor module 10000 above, since no dummy wire is used for detection of breakage of semiconductor module 10000 unlike in the conventional art, no extra area for semiconductor element 1 is required which would have been otherwise caused by installing such a dummy wire. Further, since first wiring members 401a to 401d are connected to circuit pattern 301b via resistor 5, the size of semiconductor module 10000 can be made smaller than that in the case where resistor 5 is disposed at a position different from the connection portion between circuit pattern 301b and each of first wiring members 401a to 401d. Accordingly, the manufacturing cost of semiconductor module 10000 can be suppressed from being increased.

Semiconductor module 10000 further includes second wiring members 402a, 402b as shown in FIG. 2. Second wiring members 402a, 402b directly connect semiconductor element 1 to circuit pattern 301b.

In this case, the electric resistance value of a first current path extending from semiconductor element 1 to circuit pattern 301b and constituted of first wiring members 401a to 401d and resistor 5 can be lower than the electric resistance value of a second current path, i.e., second wiring members 402a, 402b. Therefore, in the first and second current paths that constitute a parallel circuit, the value of the current flowing in second wiring members 402a, 402b serving as the second current path becomes larger than the value of the current flowing in the first current path. Therefore, a probability of occurrence of destruction of second wiring members 402a, 402b due to supply of power is higher. When each of second wiring members 402a, 402b is destroyed, the current value in the first current path becomes high, with the result that the current value in resistor 5 is changed. Moreover, on this occasion, the first current path is in a state in which power can be supplied. Hence, the function of semiconductor module 10000 itself is not impaired immediately. As a result, the change of state, which leads to destruction of semiconductor module 10000, can be detected without impairing the function of semiconductor module 10000.

In semiconductor module 10000, each of first wiring members 401a to 401d is one of a metal wire and a metal ribbon. Each of second wiring members 402a, 402b may be also one of a metal wire and a metal ribbon. Each of third wiring member 1201a and fourth wiring member 1201b may be also one of a metal wire and a metal ribbon. In this case, since each of first wiring members 401a to 401d, second wiring members 402a, 402b, third wiring member 1201a, and fourth wiring member 1201b is constituted of a comparatively general member such as the metal wire or metal ribbon, the manufacturing cost of the semiconductor module can be suppressed from being increased.

In semiconductor module 10000, resistor 5 is a member prepared separately from circuit board 3 as shown in FIG. 3 or the like and is connected to the surface of circuit pattern 301b. In this case, since resistor 5 is prepared as a member prepared separately from circuit board 3, a degree of freedom in selection of material, size, and the like of resistor 5 can be increased.

In semiconductor module 10000, resistor 5 may be a film formed on the surface of circuit pattern 301b as shown in FIG. 4. In this case, since resistor 5 can be formed on the surface of circuit pattern 301b using the vapor deposition method or the like, the thickness of resistor 5 can be made thinner than that in the case where resistor 5 is prepared as a member prepared separately from circuit board 3, and the film thickness can be adjusted precisely. Therefore, a smaller resistance value can be realized and the resistance value can be adjusted more finely.

Second Embodiment

<Configuration of Semiconductor Module>

Figure 5:
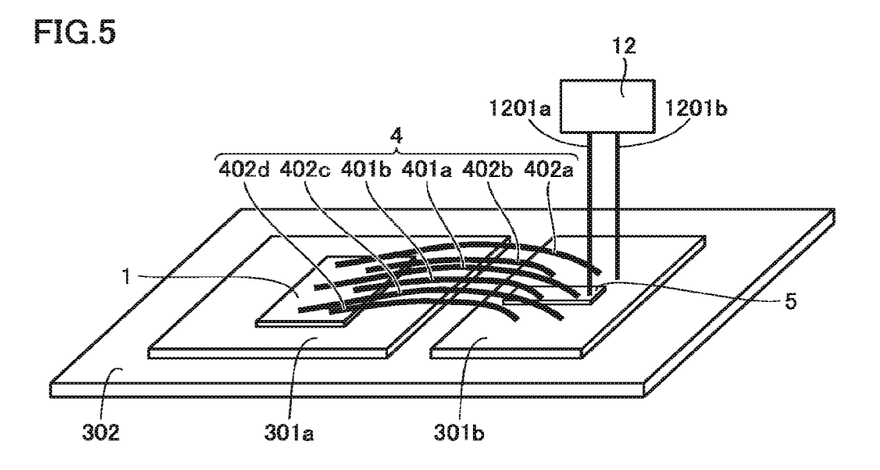
FIG. 5 is a partial schematic perspective view of a semiconductor module according to a second embodiment of the present invention.

FIG. 5 is a partial schematic perspective view of a semiconductor module according to a second embodiment of the present invention. It should be noted that FIG. 5 corresponds to FIG. 2. The semiconductor module shown in FIG. 5 has basically the same configuration as that of the semiconductor module shown in FIG. 1 and FIG. 2, but is different therefrom in terms of configurations of wiring member 4 and resistor 5. The following mainly describes portions different from those of the semiconductor module according to the first embodiment, and the same portions are not described repeatedly.

In the semiconductor module shown in FIG. 5, one end of each of first wiring members 401a, 401b of wiring members 4 is connected to the central region of semiconductor element 1. The other end of each of first wiring members 401a, 401b is connected to resistor 5. Moreover, one end of each of second wiring members 402a to 402d of wiring members 4 is connected to a peripheral region of semiconductor element 1. The other end of each of second wiring members 402a to 402d is connected to circuit pattern 301b, rather than resistor 5.

<Function and Effect>

The peripheral portion of semiconductor element 1 can dissipate heat toward circuit board 3 around semiconductor element 1. On the other hand, the central portion of semiconductor element 1 cannot efficiently dissipate heat toward its surroundings and is therefore a region having the highest temperature. When the temperature of the central portion becomes high, the temperature of the first electrode located at the central portion of semiconductor element 1 and the temperature of each of first wiring members 401a, 401b connected to the first electrode also become high. Therefore, first wiring members 401a, 401b wired to the central region of semiconductor element 1 are broken preferentially. When first wiring members 401a, 401b are broken, power cannot be supplied to resistor 5. Accordingly, the current value and voltage drop value in resistor 5 become zero. Such a noticeable state that the current and voltage drop become zero can be readily detected by detector 12. At the point of time at which detector 12 measures that the current value or voltage drop value in resistor 5 has become zero, many of second wiring members 402a to 402d, each of which is a wire or ribbon that can be utilized for supply of power, remain. Accordingly, the function of the semiconductor module is not impaired immediately. In the manner described above, breakage of semiconductor module 10000 can be detected in advance.

That is, such a noticeable state that the current value and voltage drop value in resistor 5 are zero is readily detected by detector 12. Accordingly, for example, during the operation of semiconductor module 10000 or the like, a change of state of semiconductor module 10000 can be securely detected even under an environment involving external disturbance to an electrical signal.

Third Embodiment

<Configuration of Semiconductor Module>

Figure 6:
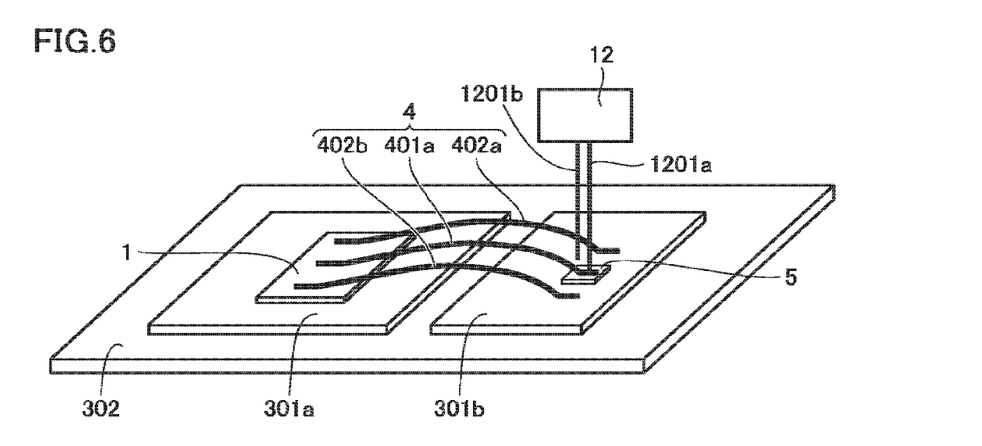
FIG. 6 is a partial schematic perspective view of a semiconductor module according to a third embodiment of the present invention.

FIG. 6 is a partial schematic perspective view of a semiconductor module according to a third embodiment of the present invention. It should be noted that FIG. 6 corresponds to FIG. 2. The semiconductor module shown in FIG. 6 includes basically the same configuration and attains basically the same effect as those of the semiconductor module shown in FIG. 1 and FIG. 2, but is different therefrom in terms of configurations of wiring member 4, resistor 5, and detector 12. The following mainly describes portions different from those of the semiconductor module according to the first embodiment, and the same portions are not described repeatedly.

In the semiconductor module shown in FIG. 6, the end portion of first wiring member 401a wired to resistor 5 is connected to the end portion of third wiring member 1201a that electrically connects detector 12 to resistor 5.

Figure 7:
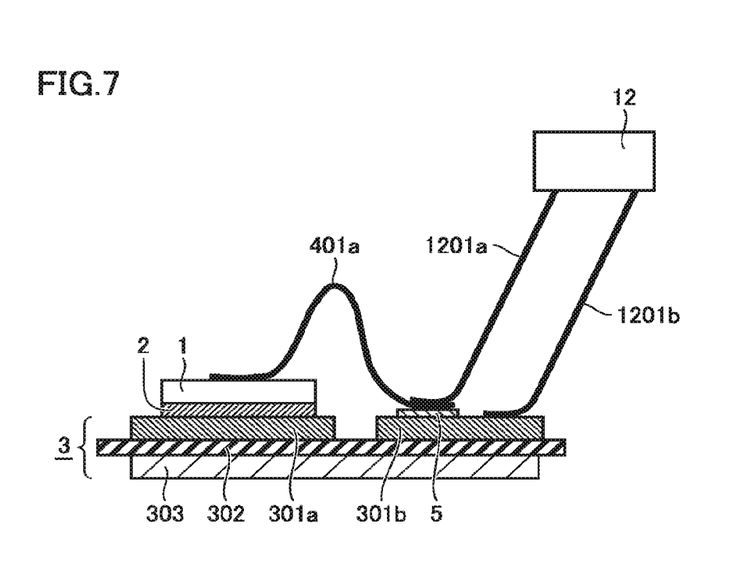
FIG. 7 is a partial schematic cross sectional view showing a specific example of the semiconductor module shown in FIG. 6.

FIG. 7 is a partial schematic cross sectional view showing a specific example of the semiconductor module shown in FIG. 6. With reference to FIG. 7, the specific example of the semiconductor module shown in FIG. 6 will be described.

In the semiconductor module shown in FIG. 7, each of first wiring member 401a and third and fourth wiring members 1201a, 1201b is a metal wire, and is preferably a metal wire mainly composed of aluminum. First wiring member 401a is ultrasonically joined to semiconductor element 1 and resistor 5. Third wiring member 1201a is ultrasonically joined from above end portion 41 to end portion 41 of first wiring member 401a connected to resistor 5. In FIG. 7, first wiring member 401a and third wiring member 1201a are disposed to extend to resistor 5 in different directions, specifically, opposite directions.

Also, an end portion of fourth wiring member 1201b that connects detector 12 to circuit pattern 301b is connected to a surface of circuit pattern 301b by wire bonding. The metal wire, particularly, the wire mainly composed of aluminum, is excellent in deformability. Therefore, as described above, third wiring member 1201a can be readily wire-bonded onto end portion 41.

<Function and Effect>

Semiconductor module 10000 includes third wiring member 1201a and fourth wiring member 1201b. Third wiring member 1201a electrically connects detector 12 to resistor 5. Fourth wiring member 1201b electrically connects resistor 5 to the detector via circuit pattern 301b. First wiring member 401a includes end portion 41 connected to resistor 5. Third wiring member 1201a includes an end portion 1210 that overlaps with end portion 41 of first wiring member 401a and that serves as a connection portion directly connected to end portion 41.

In this case, since end portion 1210 of third wiring member 1201a that connects detector 12 to resistor 5 overlaps with end portion 41 of first wiring member 401a, an area of the semiconductor module can be made smaller than that in the case where end portion 41 of first wiring member 401a and end portion 1210 of third wiring member 1201a are located in different regions. From a different viewpoint, it is said that since resistor 5, first wiring member 401a, and third wiring member 1201a are stacked on one another at their connection region, a footprint of the portion in circuit board 3 becomes small. Here, in recent years, in response to demands for high integration and high output density in semiconductor modules, the footprints of the semiconductor modules tend to be decreased. Therefore, by employing the above-described configuration with the small footprint, applicability of the semiconductor module according to the present embodiment to actual products and a degree of freedom in design of the semiconductor module can be increased.

Fourth Embodiment

<Configuration of Semiconductor Module>

Figure 8:
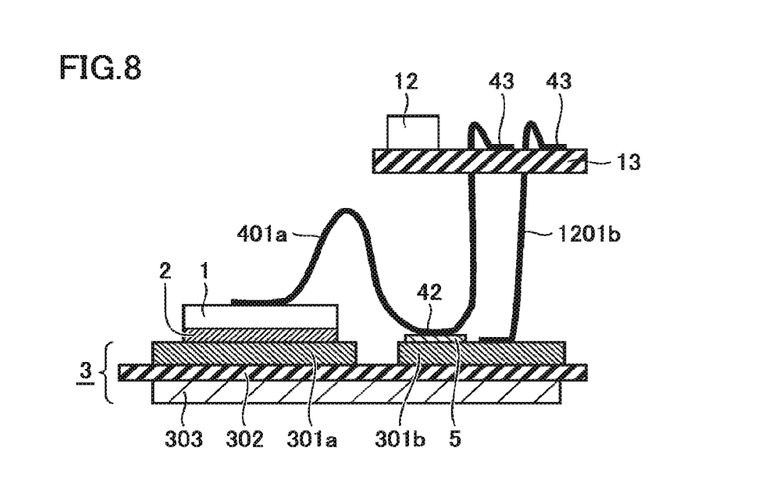
FIG. 8 is a partial schematic cross sectional view of a semiconductor module according to a fourth embodiment of the present invention.
Figure 9:
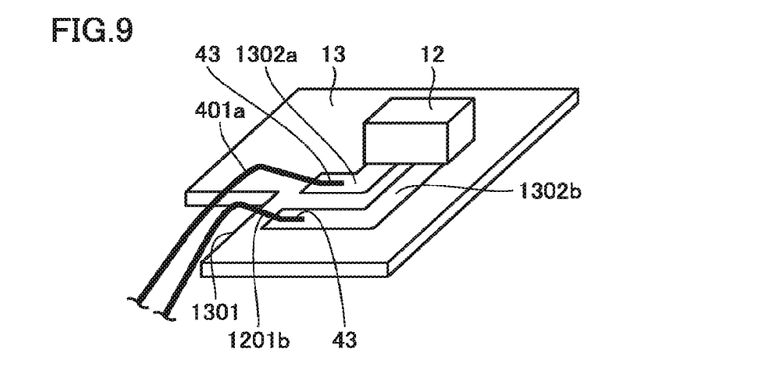
FIG. 9 is a partial schematic view of the semiconductor module shown in FIG. 8.

FIG. 8 is a partial schematic cross sectional view of a semiconductor module according to a fourth embodiment of the present invention. It should be noted that FIG. 8 corresponds to FIG. 7. FIG. 9 is a partial schematic view of a semiconductor module shown in FIG. 8. The semiconductor module shown in FIG. 8 and FIG. 9 includes basically the same configuration and attains basically the same effect as those of the semiconductor module shown in FIG. 1 and FIG. 2, but is different therefrom in terms of configurations of first wiring member 401a and detector 12. The following mainly describes portions different from those of the semiconductor module according to the first embodiment, and the same portions are not described repeatedly.

In the semiconductor module shown in FIG. 8 and FIG. 9, first wiring member 401a is a metal wire, for example. First wiring member 401a is stitch-bonded to a region 42 located on resistor 5. As a result, region 42 of first wiring member 401a is connected to resistor 5. Then, end portion 43 of first wiring member 401a is connected to circuit pattern 1302a disposed on a surface of a printed board 13. A circuit pattern 1302b is also formed on the surface of printed board 13. Detector 12 is mounted on printed board 13. Detector 12 is connected to circuit patterns 1302a, 1302b. As a result, semiconductor element 1, resistor 5, and detector 12 are electrically connected to one another via first wiring member 401a.

Printed board 13 is disposed at a position facing circuit board 3 as shown in FIG. 8. One end of fourth wiring member 1201b is connected to circuit pattern 1302b of printed board 13. The other end of fourth wiring member 1201b is connected to circuit pattern 301b.

Printed board 13 is provided with a notch 1301 for allowing first wiring member 401a and fourth wiring member 1201b to pass therethrough. Printed board 13 is sized and arranged so as not to hinder wiring of first wiring member 401a and fourth wiring member 1201b. For example, in a plan view, the configuration of the semiconductor module is determined such that a connection portion between semiconductor element 1 and first wiring member 401a and a connection portion between resistor 5 and first wiring member 401a do not overlap with printed board 13. Circuit pattern 1302 is provided on printed board 13, whereby detector 12 and wiring member 4 are electrically connected to each other.

<Function and Effect>

In semiconductor module 10000, first wiring member 401a includes an extending portion from region 42 to end portion 43. The extending portion is a portion that connects resistor 5 to detector 12. In this case, first wiring member 401a connects semiconductor element 1 to resistor 5, and also has a function as a connection member for resistor 5 and detector 12. Since first wiring member 401a and resistor 5 are connected to each other at one portion, i.e., region 42, the area of resistor 5 can be made smaller than that in the case where connection portions are formed for first wiring member 401a and respective different members. Here, in recent years, in response to demands for high integration and high output density in semiconductor modules, the footprints of the semiconductor modules tend to be decreased. Therefore, by employing the above-described configuration with the small footprint, applicability of the semiconductor module according to the present embodiment to actual products and a degree of freedom in design of the semiconductor module can be increased.

Fifth Embodiment

<Configuration of Semiconductor Module>

Figure 10:
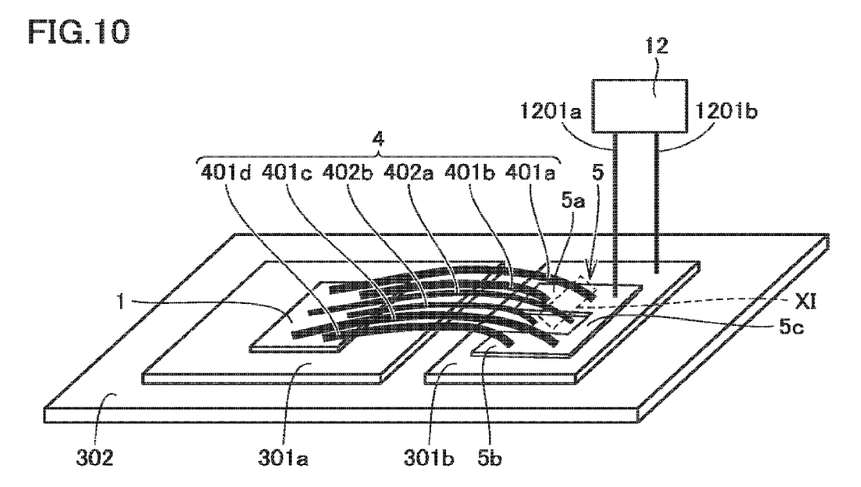
FIG. 10 is a partial schematic perspective view of a semiconductor module according to a fifth embodiment of the present invention.
Figure 11:
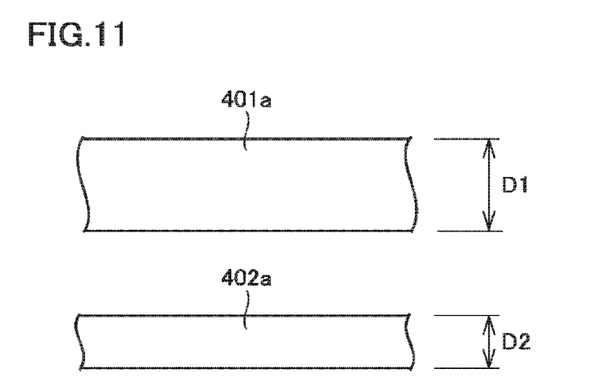
FIG. 11 is an enlarged schematic view of a region XI shown in FIG. 10.

FIG. 10 is a partial schematic perspective view of a semiconductor module according to a fifth embodiment of the present invention. FIG. 10 corresponds to FIG. 2. FIG. 11 is an enlarged schematic view of a region XI shown in FIG. 10. The semiconductor module shown in FIG. 10 and FIG. 11 includes basically the same configuration as that of the semiconductor module shown in FIG. 1 and FIG. 2, but is different therefrom in terms of a configuration of wiring member 4. The following mainly describes portions different from those of the semiconductor module according to the first embodiment, and the same portions are not described repeatedly.

In the semiconductor module shown in FIG. 10 and FIG. 11, the diameter of each of first wiring members 401a to 401d, which are electrically conductive wires, is relatively larger than the diameter of each of second wiring members 402a, 402b, which are electrically conductive wires.

<Function and Effect>

With the above configuration, breakage of second wiring members 402a, 402b more securely takes place prior to breakage of first wiring members 401a to 401d. Moreover, with the design of the diameters (wire diameters) of first wiring members 401a to 401d and second wiring members 402a, 402b, it is possible to adjust occurrence of breakage of second wiring members 402a, 402b in accordance with what ratio of a period has elapsed with respect to the total life period of the semiconductor module.

Moreover, for example, when each of first wiring members 401a to 401d and second wiring members 402a, 402b has a ribbon shape, the area (ribbon joining area) of the joining surface of each of first wiring members 401a to 401d with resistor 5 may be increased with respect to the ribbon joining area of each of second wiring members 402a, 402b with circuit pattern 301b. Also in this case, breakage of second wiring members 402a, 402b more securely takes place prior to breakage of first wiring members 401a to 401d. Moreover, with the design of the ribbon joining areas, it is possible to adjust occurrence of breakage of second wiring members 402a, 402b in accordance with what ratio of a period has elapsed with respect to the total life period of the semiconductor module.

As another exemplary configuration, by adjusting bonding parameters of first wiring members 401a to 401d and second wiring members 402a, 402b, the joining strength of each of second wiring members 402a, 402b with circuit pattern 301b may be made weaker than the joining strength of each of first wiring members 401a to 401d with resistor 5. Alternatively, after joining second wiring members 402a, 402b to circuit pattern 301b, mechanical damage (such as machining for forming a cut) may be applied to the joining portion. Alternatively, by forming a groove in the upper surface of circuit pattern 301b and connecting second wiring members 402a, 402b onto the groove, the joining area of each of second wiring members 402a, 402b with circuit pattern 301b can be made small. Also with such a configuration, there can be provided the same effect as that of the above-described semiconductor module shown in FIG. 10 and FIG. 11.

The embodiments disclosed herein are illustrative and non-restrictive in any respect. The scope of the present invention is defined by the terms of the claims, rather than the embodiments described above, and is intended to include any modifications within the scope and meaning equivalent to the terms of the claims.

REFERENCE SIGNS LIST

1: semiconductor element; 2, 6, 16: joining material; 3: circuit board; 4, 10: wiring member; 5: resistor; 5a: first region; 5b: second region; 5c: third region; 7: base plate; 8: case; 9: sealing material; 11: external terminal; 12: detector; 13: printed board; 17: surface; 41, 43, 1210: end portion; 41a, 401a, 1210a: recess; 42: region; 301a, 301b, 1302a, 1302b: circuit pattern; 302: insulating member; 303: member; 401a to 401d: first wiring member; 402a to 402d:

second wiring member; 1201*a*: third wiring member; 1201*b*: fourth wiring member; 1301: notch; 10000: semiconductor module.

The invention claimed is:

1. A semiconductor module comprising:
   a semiconductor element;
   a circuit board including a circuit pattern;
   a resistor connected to a surface of the circuit pattern;
   a first wiring member in which at least part of current flowing from the semiconductor element to the circuit pattern flows, the first wiring member directly connecting the semiconductor element to the resistor; and
   a detector to detect at least one of a change of a voltage drop value in the resistor and a change of a current value in the resistor;
   wherein the resistor is a film formed on the surface of the circuit pattern.

2. The semiconductor module according to claim 1, further comprising a second wiring member that directly connects the semiconductor element to the circuit pattern.

3. The semiconductor module according to claim 1, wherein the first wiring member is one of a metal wire and a metal ribbon.

4. The semiconductor module according to claim 1, comprising:
   a third wiring member that electrically connects the detector to the resistor; and
   a fourth wiring member that electrically connects the resistor to the detector via the circuit pattern, wherein
   the first wiring member includes an end portion connected to the resistor, and
   the third wiring member includes a connection portion that overlaps with the end portion of the first wiring member and that is directly connected to the end portion.

5. The semiconductor module according to claim 4, wherein each of the third wiring member and the fourth wiring member is one of a metal wire and a metal ribbon.

6. The semiconductor module according to claim 1, wherein the first wiring member includes a portion that connects the resistor to the detector.

7. The semiconductor module according to claim 1, wherein one end of the first wiring member is connected to a central region of the semiconductor element.

* * * * *